(12) United States Patent
Ng

(10) Patent No.: US 9,647,663 B1
(45) Date of Patent: May 9, 2017

(54) DIFFERENTIAL INPUT BUFFER CIRCUITS AND METHODS

(71) Applicant: Altera Corporation, San Jose, CA (US)

(72) Inventor: Hoong Chin Ng, Sungai Petani (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/193,518

(22) Filed: Jun. 27, 2016

(51) Int. Cl.
| H03K 17/16 | (2006.01) |
| H03K 19/003 | (2006.01) |
| H03K 19/018 | (2006.01) |
| H03K 19/00 | (2006.01) |
| H03K 19/177 | (2006.01) |

(52) U.S. Cl.
CPC ... *H03K 19/01825* (2013.01); *H03K 19/0005* (2013.01); *H03K 19/17744* (2013.01)

(58) Field of Classification Search
None
See application file for complete search history.

(56) References Cited

U.S. PATENT DOCUMENTS

| 5,559,448 A * | 9/1996 | Koenig | H03H 11/30 326/30 |
| 6,445,245 B1 | 9/2002 | Schultz et al. | |
| 6,586,964 B1 * | 7/2003 | Kent | H04L 25/0298 326/30 |
| 6,603,329 B1 * | 8/2003 | Wang | H04L 25/0278 326/30 |
| 6,683,473 B2 | 1/2004 | Fotouhi | |
| 7,205,788 B1 | 4/2007 | Wang et al. | |
| 7,218,155 B1 | 5/2007 | Chang et al. | |
| 7,221,193 B1 | 5/2007 | Wang et al. | |
| 7,368,938 B2 | 5/2008 | Ding et al. | |
| 7,372,295 B1 * | 5/2008 | Wei | H04L 25/0278 326/27 |
| 7,417,452 B1 | 8/2008 | Wang et al. | |
| 7,420,386 B2 | 9/2008 | Wang et al. | |
| 7,423,450 B2 | 9/2008 | Santurkar et al. | |
| 7,443,193 B1 | 10/2008 | Santurkar et al. | |
| 7,973,553 B1 | 7/2011 | Wang et al. | |

* cited by examiner

*Primary Examiner* — Anh Tran

(57) ABSTRACT

An input buffer circuit that receives differential signals includes a first resistive path circuit, a second resistive path circuit and a feedback circuit. The first resistive path circuit may generate a first common mode voltage from the differential signals. The feedback circuit is coupled to the first resistive path circuit. The feedback circuit receives the first common mode voltage as an input. The second resistive path circuit includes a transistor circuit and a resistor formed in a serial circuit configuration. The second resistive path circuit may generate a second common mode voltage on a node formed between the transistor circuit and the resistor by controlling activation of the transistor circuit using outputs from the feedback circuit. The first common mode voltage may be substantially identical to the second common mode voltage.

20 Claims, 6 Drawing Sheets

US 9,647,663 B1

DIFFERENTIAL INPUT BUFFER CIRCUITS AND METHODS

FIELD OF THE DISCLOSURE

This disclosure relates to electronic circuits, and more particularly, to differential input buffer circuits and methods.

BACKGROUND

Input/output (I/O) circuits are used for transferring signals into or out of an integrated circuit (IC) device. The signals are transferred using specific signal transmission protocols. These protocols are generally classified into two classes, which are either a single-ended protocol or a differential protocol.

A differential protocol is preferred when the signals that are being transmitted are sensitive to noise. A differential protocol helps to eliminate noise by using two signals that are complementary to each other. Some of the common differential transmission protocols are the low voltage differential signaling (LVDS) protocol and the low voltage positive emitter coupled logic (LVPECL) protocol.

An I/O buffer circuit, which usually forms part of the I/O circuit, is generally utilized for providing input impedances or output impedances. However, a pin capacitance on an I/O buffer circuit has become a crucial designing consideration as the industry moves towards high speed as well as low power I/O circuits.

differential I/O buffer circuit generally includes a large pin capacitance because of its large sized resistors and large sized transistor. The large pin capacitance has significantly affected advancement towards transferring high speed differential signals through the differential I/O buffer circuit.

SUMMARY

Embodiments described herein include a differential input buffer circuit. It should be appreciated that the embodiments can be implemented in numerous ways, such as a process, an apparatus, a system, a device, or a method. Several embodiments are described below.

In one embodiment, an input buffer circuit that receives differential signals includes a first resistive path circuit, a second resistive path circuit and a feedback circuit. The first resistive path circuit may generate a first common mode voltage from the differential signals. The feedback circuit is coupled to the first resistive path circuit. The feedback circuit receives the first common mode voltage as an input. The second resistive path circuit includes a transistor circuit and a resistor coupled together in a serial circuit configuration. The second resistive path may generate a second common mode voltage on a node formed between the transistor circuit and the resistor by controlling the transistor circuit using outputs from the feedback circuit. The first common mode voltage may be identical to the second common mode voltage.

In another embodiment, an input/output (I/O) buffer circuit includes first and second operational amplifier circuits, first and second transistors and a first resistor. Each of the first and second operational amplifier circuits has an output terminal. The first and second transistors are formed in a parallel circuit configuration. A gate terminal of the first transistor is coupled to the output terminal of the first operational amplifier circuit, and a gate terminal of the second transistor is coupled to the output terminal of the second operation amplifier circuit. The first resistor is coupled in a series circuit configuration with the first and second transistors. A voltage drop across the first and second transistors may be equivalent to a voltage drop across the first resistor.

In a different embodiment, an input termination circuit receiving differential signals includes a first resistive path and a second resistive path. The first resistive path may further include a first transistor circuit and a first resistor. The first transistor circuit may receive a positive part of the differential signals and is controlled through outputs of a negative feedback loop. The first resistor is coupled in a series circuit configuration with the first transistor circuit. The second resistive path includes a second transistor circuit and a second resistor. The second transistor circuit may receive a negative part of the differential signals and is also controlled through the outputs of the negative feedback loop. The second resistor is coupled in a series circuit configuration with the second transistor circuit.

Further features of the present invention, its nature and various advantages will be more apparent from the accompanying drawings and the following detailed description of the preferred embodiments.

DETAILED DESCRIPTION

The following embodiments include a differential input buffer circuit. It should be understood that the present exemplary embodiments may be practiced without some or all of these specific details. In other instances, well-known operations have not been described in detail in order not to unnecessarily obscure the present embodiments.

Throughout this specification, when an element is referred to as being "connected" or "coupled" to another element, it may be directly connected or coupled to the other element or electrically connected or coupled to the other element with yet another element interposed between them.

Figure 1:
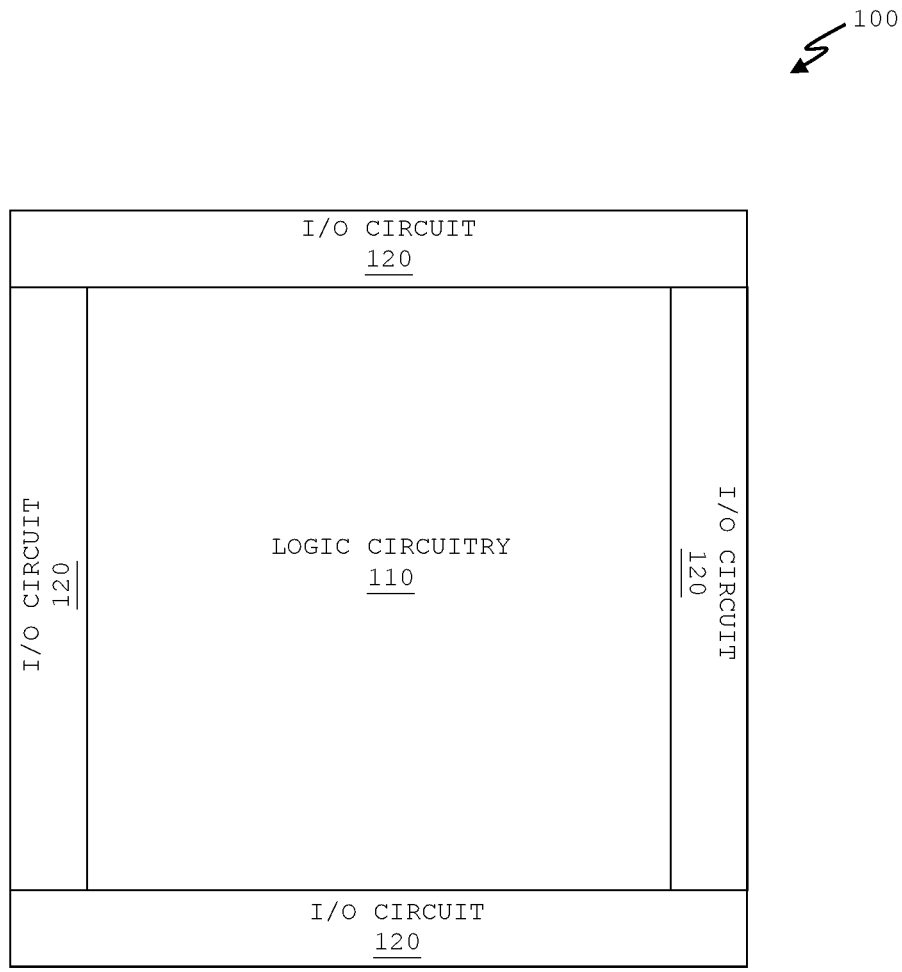
FIG. 1 shows an illustrative integrated circuit (IC) device in accordance with one embodiment of the present invention.

FIG. 1, meant to be illustrative and not limiting, illustrates an integrated circuit (IC) device in accordance with one embodiment of present invention. Integrated circuit device 100 includes logic circuitry 110 and multiple input/output (I/O) circuits 120.

In one embodiment, integrated circuit device 100 may be an application specific integrated circuit (ASIC) device, an application standard specific product (ASSP) device, a programmable logic device (PLD) or a microprocessor device. In general, the ASIC, ASSP and microprocessor devices may perform fixed and dedicated functions. The PLD devices may be programmable to perform a variety of functions. An example of a PLD device may be a field programmable gate array (FPGA) device. Microprocessor devices, coupled together with other devices (e.g., a memory device), may be utilized to perform instructions provided within a programming code.

Integrated circuit device 100 may be used in different types of high speed systems, for example, communication systems such as wireless systems, wired systems, etc. In one embodiment, integrated circuit device 100 may be a PLD utilized for controlling data transfer between different devices, for example, a microprocessor device and/or a memory device. In addition to that, integrated circuit device 100 may include circuits to allow integrated circuit device 100 to communicate with external devices. Each of these circuits may be defined based on a particular signal protocol, such as the low voltage differential signaling (LVDS) protocol and the low-voltage positive emitter-coupled logic (LVPECL) protocol.

Referring still to FIG. 1, I/O circuits 120 occupy the peripheral portion of integrated circuit device 100, whereas logic circuitry 110 occupies the center region of integrated circuit device 100. It should be appreciated that the arrangement of I/O circuits 120 and logic circuitry 110 on integrated circuit device 100 may vary depending on the requirements of a particular device.

In one embodiment, logic circuitry 110 may perform core functions of integrated circuit device 100. Logic circuitry 110 may include specific circuitry for the functions that define integrated circuit device 100. For example, logic circuitry 110 may include circuits that process information received by integrated circuit device 100. In another example, logic circuitry 110 may include programmable logic elements when the integrated circuit device is a PLD. The programmable logic elements may further include circuits such as look-up table (LUT) circuitry, multiplexers, product-term logic, registers, memory circuits and the like. The programmable logic elements may be programmed by a user (e.g., a designer or an engineer) to perform desired functions.

I/O circuits 120 may be utilized for transferring signals into or out of integrated circuit device 100. For example, signals from logic circuitry 110 may be transferred out of integrated circuit device 100 through one of these I/O circuits 120. Additionally, signals received from an external device (external to integrated circuit device 100) may be transferred to logic circuitry 110 through one of these I/O circuits 120. In one embodiment, I/O circuits 120 may be considered as external interfacing circuitry of integrated circuit device 100. Signals may be transferred out or received by each of these I/O circuits 120 through its respective I/O pads (not shown).

Each I/O circuit 120 may further include an I/O buffer circuit (not shown). Generally, the I/O buffer circuit functions to provide input and/or output termination impedances. In one exemplary embodiment, the I/O buffer circuit may have an input termination impedance of 50 Ohms when receiving the signals and may have an output termination impedance of 50 Ohms when transmitting the signals.

The I/O buffer circuit within each I/O circuit 120 may be configurable to receive signals and/or to transmit signals. It should be appreciated that the I/O buffer circuits may be configured through user inputs. In one embodiment, the user may input these user inputs using configuration software (e.g., Quartus® Prime of Intel® Corporation). Through these user inputs, the user may configure the I/O buffer circuits and may enable integrated circuit device 100 to communicate externally using different signal protocols.

The I/O buffer circuit may receive and/or transmit single-ended signals and/or differential signals. In one exemplary embodiment, the I/O buffer circuit may be transmitting and/or receiving the differential signals that are based on the LVDS transmission protocol. In another exemplary embodiment, the I/O buffer circuit may be transmitting and/or receiving the differential signals that are based on the LVPECL transmission protocol.

Each I/O buffer circuit may also have a low pin capacitance. In one embodiment, each I/O buffer circuit may only have 50% of the pin capacitance of an I/O buffer circuit that is designed based on conventional techniques, which includes serially coupled transistors and resistors to form termination impendences.

Figure 2:
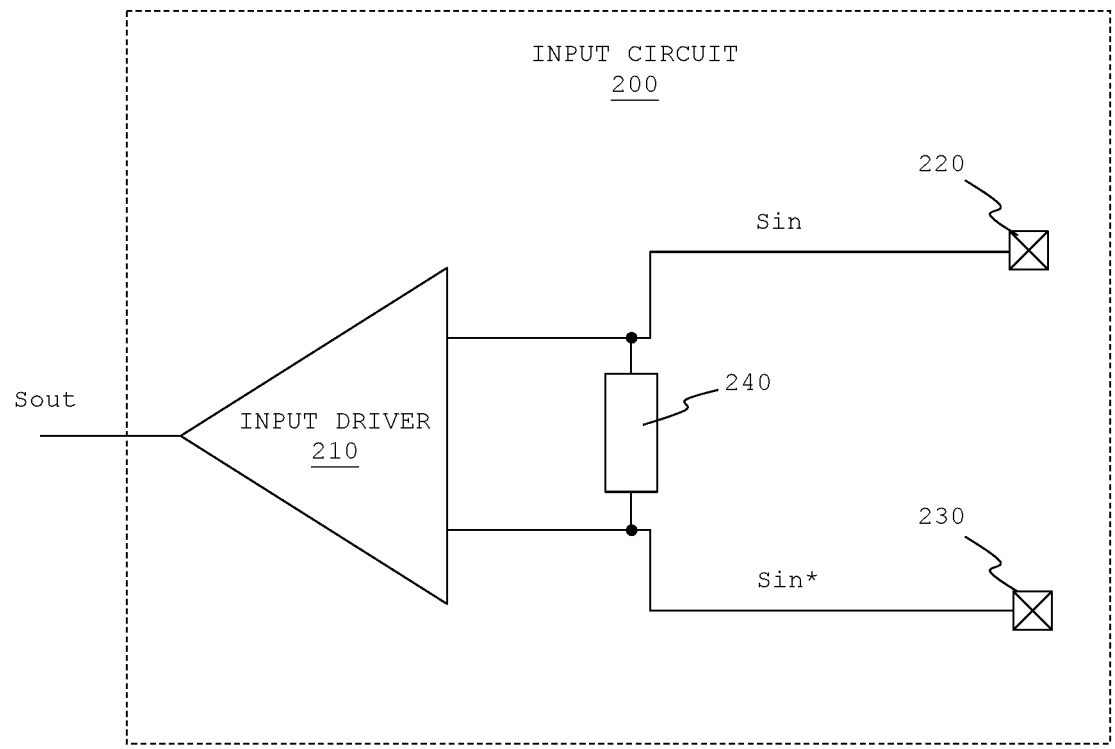
FIG. 2 shows an illustrative input circuit within an integrated circuit device in accordance with one embodiment of the present invention.

FIG. 2, meant to be illustrative and not limiting, illustrates an input circuit within an integrated circuit device in accordance with one embodiment of the present invention. Input circuit 200 may be formed as a part of I/O circuit 120 of FIG. 2, in one embodiment. Input circuit 200 may drive signals received from an external device (e.g., a device forming part of a telecommunication network system) to other circuitry in the integrated circuit device.

As shown in the embodiment of FIG. 2, input circuit 200 includes input driver 210, pads 220 and 230 and input buffer circuit 240. Pads 220 and 230 are coupled to different input terminals of input driver 210. In one embodiment, pads 220 and 230 may be coupled to a positive input terminal and a negative input terminal, respectively, of input driver 210. Pads 220 and 230 are coupled to different input terminals of input driver 210 through signal interconnections. In one embodiment, the signal interconnections may be signal traces formed within an integrated circuit device (e.g., integrated circuit device 100 of FIG. 1).

Input termination circuit 240 may be formed between pads 220 and 230 and input driver 210. In the embodiment of FIG. 2, input termination circuit 240 may be coupled to the signal interconnections. Input termination circuit 240 may provide 50 Ohms termination impedances to incoming differential signals, in one exemplary embodiment. In another exemplary embodiment, input termination circuit 240 may provide 100 Ohms termination impedances to the incoming differential signals.

Input termination circuit 240 may include at least two resistive path circuits (not shown in FIG. 2). The resistive path circuits may include multiple transistors and resistors. The transistors formed on the resistive paths are relatively small (in size) and therefore may have low parasitic capacitances. The resistive path circuits may allow formation of relatively small transistors because input termination circuit 240 generates input termination impedances using common mode voltages, which is unlike the conventional manner of voltage splitting using a voltage dividing technique.

In one exemplary embodiment, one of the resistive path circuits may generate a common mode voltage from the incoming differential signals. The other resistive path circuit, which forms a part of a negative feedback loop, includes transistors that are controlled by the outputs of the feedback loop to generate desired termination impedances.

As shown in the embodiment of FIG. 2, input circuit 200 receives differential signals Sin and Sin* through pads 220 and 230, respectively. The Sin and Sin* signals may be in accordance to the LVDS or LVPECL signal protocol. The signals Sin and Sin* are then transmitted to the input terminals of input driver 210. However, the transmission of the signals Sin and Sin* into input driver 210 depends on the impedances generated at termination circuit 240. In one embodiment, the input impedances at termination circuit 240 matches the impedances of external transmission lines (not shown) that are coupled to pads 220 and 230. In such instances, the signals Sin and Sin* may be transmitted seamlessly without much of the signals being lost as a result of reflections (i.e., a low return loss RL). In an alternative embodiment, the input impedances of termination circuit 240 may not match the impedances values of the external transmission lines coupled to pads 220 and 230. In such instances, the signals Sin and Sin* may largely be reflected from pads 220 and 230 back to the external transmission lines, and as such may result in a high return loss RL.

Input driver 210 may generate an output signal Sout by subtracting the received signals Sin from Sin*. In one embodiment, Sout is in accordance to the function of equation (1) below.

$$Sout=Sin-(Sin^*) \qquad (1)$$

Figure 3:
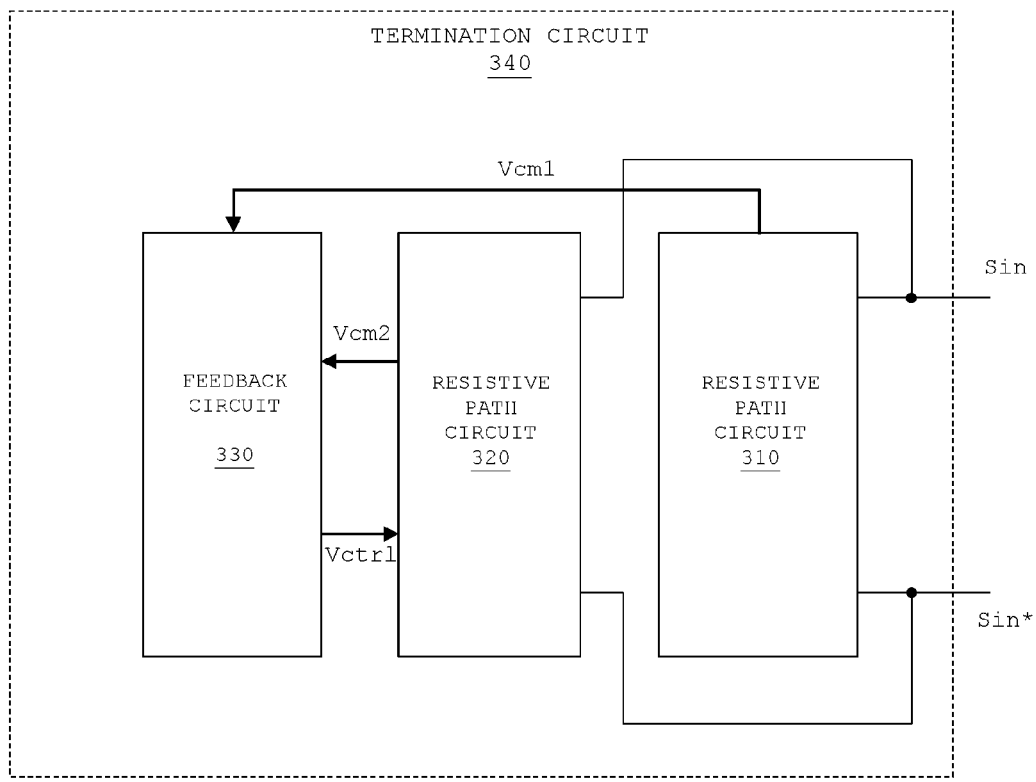
FIG. 3 shows an illustrative termination block in accordance with one embodiment of the present invention.

FIG. 3, meant to be illustrative and not limiting, illustrates a termination block in accordance with one embodiment of the present invention. In one embodiment, termination block 340 may be similar to termination circuit 240 of FIG. 2, however, in a circuit block. Termination block 340 may generate input impedances that match the external interconnections (e.g., transmission lines) so that the signals may enter the integrated circuit device seamlessly without significant signal reflections.

As shown in the embodiment of FIG. 3, termination block 340 may include resistive path circuits 310 and 320 and feedback circuit 330. Resistive path circuits 310 and 320 may be similar to voltage divider circuits, which generally include multiple resistors coupled in series configurations. Hence, any voltage that is supplied across resistive path circuits 310 and 320 may be divided depending on resistances of the resistors.

Resistive path circuit 310 may receive differential signals Sin and Sin*. In one embodiment, the Sin and Sin* signals may be similar to the Sin and Sin* signals described in FIG. 2. Therefore, details of the Sin and Sin* signals will not be repeated for the sake of brevity. Resistive path circuit 310 may generate a common mode voltage (Vcm1) from the Sin and Sin* signals. The Vcm1 voltage is a voltage level at a node formed between the serially coupled resistors. In one embodiment, Vcm1 may be in accordance to the function shown in equation (2) below.

$$Vcm1=(Sin+Sin^*)/2 \qquad (2)$$

Referring still to FIG. 3, the Vcm1 voltage may be supplied to feedback circuit 330. In one embodiment, feedback circuit 330 may include two operational amplifier (op-amp) circuits that are arranged to form two negative feedback loops. Feedback circuit 330 may also receive another common mode voltage (Vcm2) that is generated by resistive path circuit 320. Feedback circuit 330 using these two inputs (i.e., Vcm1 and Vcm2) may generate a control signal (Vctrl) to control the impedances of resistive path circuit 320. In one embodiment, resistive path circuit 320 may be controlled to generate 50 Ohms resistances for the incoming differential signals. In an alternative embodiment, resistive path circuit 320 may be controlled to generate 100 Ohms resistances for the incoming differential signals.

Figure 4:
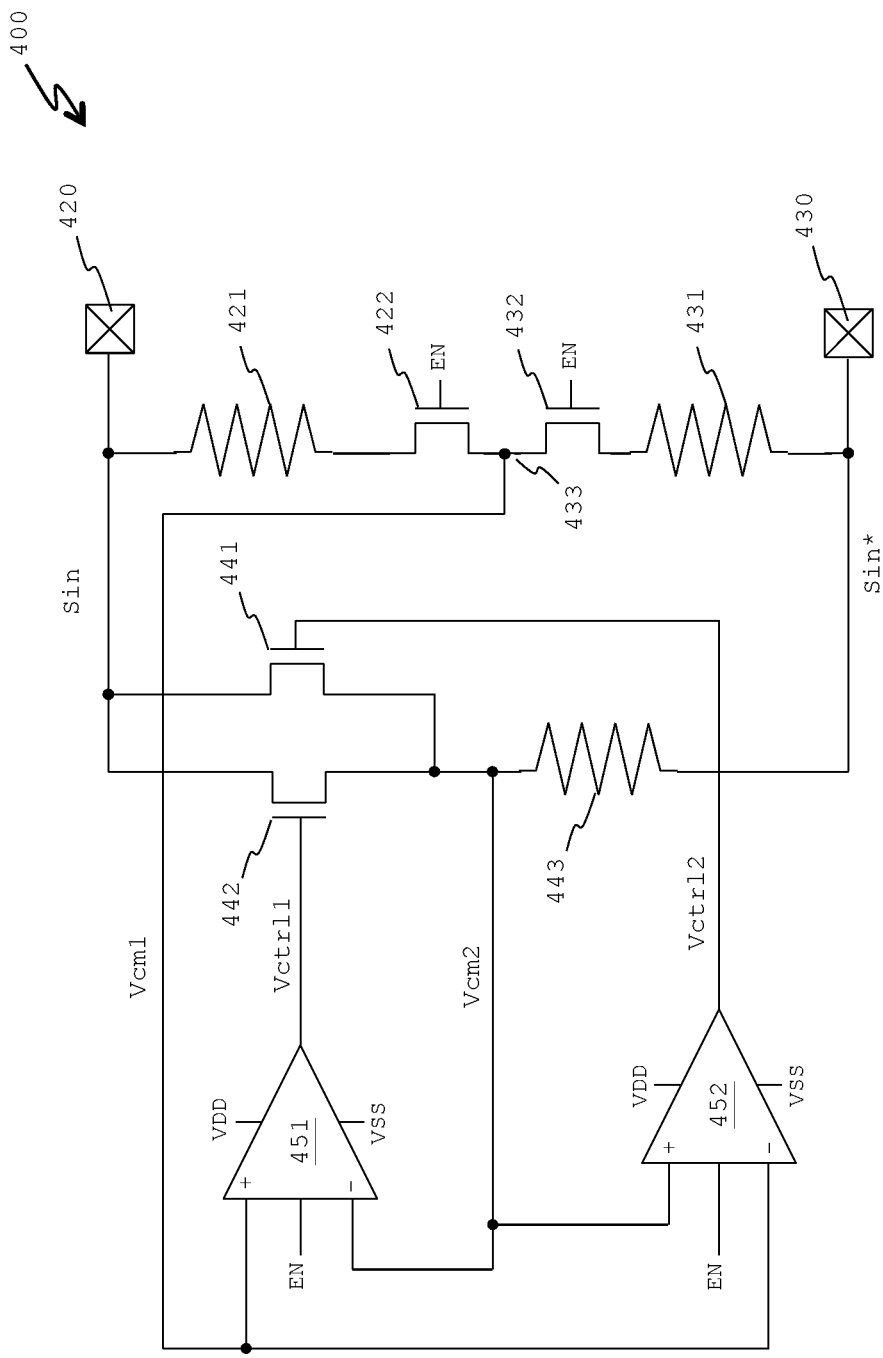
FIG. 4 shows an illustrative detailed implementation of a termination circuit in accordance with one embodiment of the present invention.

FIG. 4, meant to be illustrative and not limiting, illustrates a detailed implementation of a termination circuit in accordance with one embodiment of the present invention. Termination circuit 400 may be an example of termination circuit 240 of FIG. 2 or termination block 340 of FIG. 3.

As shown in the embodiment of FIG. 4, termination circuit 400 may include pads 420 and 430, transistors 422, 432, 441 and 442, resistors 421, 431 and 443, and operational amplifiers (op-amps) 451 and 452.

Pads 420 and 430 may be similar to pads 220 and 230, respectively, of FIG. 2. As shown in FIG. 4, pad 420 may receive signal Sin, and pad 430 may receive signal Sin*. In one embodiment, the signal Sin* is complementary to the signal Sin. The signals Sin and Sin* may be in accordance to the LVDS protocol or LVPECL protocol. Generally, the signals Sin and Sin* may be digital signals (e.g., square waveform signals).

Resistors 421 and 431 and transistors 422 and 432 may form a resistive path circuit. In one embodiment, resistors 421 and 431 and transistors 422 and 432 may form resistive path circuit 310 of FIG. 3. Transistors 422 and 432 may be n-channel transistors, such as n-channel metal oxide semiconductor (NMOS) transistors. Gate terminals of transistors 422 and 432 may be supplied with an enable signal (i.e., EN signal). The EN signal is at a logic high value when an I/O circuit (e.g., I/O circuit 120 of FIG. 1) is configured to be in a receiver mode. The EN signal is at a logic low value when the I/O circuit is configured to be in a transmitter mode. The EN signal is also provided to enabling inputs of op-amps 451-452. Op-amps 451-452 are enabled in response to the EN signal having a logic high value.

Resistors 421 and 431 and transistors 422 and 432 may form a voltage divider circuit. An output of the voltage divider circuit is tapped from node 433. In the embodiment of FIG. 4, the output at node 433 is referred to as a common mode voltage (Vcm1).

In one embodiment, resistances of resistors 421 and 431 are identical. For example, the resistors 421 and 431 may have resistances of approximately 0.5 kilo Ohms (KOhms) to 10 KOhms. Furthermore, transistors 422 and 432 may have identical dimensions, specifically in their widths. In one embodiment, transistors 422 and 432 may have relatively small widths in order to form relatively small-sized transistors. The purpose of having the relatively small-sized transistors is for minimizing parasitic capacitances generated on source-drain terminals of transistors 422 and 432. However, the relatively small transistors 422 and 432 may have relatively large resistances. In one embodiment, transistors 422 and 432 may have widths that correspond to impedances that are valued between 0.5 KOhms to 10 KOhms of resistances.

In one embodiment, the total resistance of the above-mentioned resistive path, which includes resistors 421 and 431 and transistors 422 and 432, may have a minimal impact on the effective impedance of the differential input termination. However, the common mode voltage Vcm1 that is generated at node 433 may be important for generating the desired input impedances.

In FIG. 4, the Vcm1 voltage is supplied to op-amps 451 and 452. In one embodiment, the Vcm1 voltage is supplied to a positive input terminal (shown as '+') of op-amp 451 and a negative input terminal (shown as '−') of op-amp 452. The other input terminals of op-amps 451 and 452 are supplied with another common mode voltage, Vcm2. As shown in the embodiment of FIG. 4, the Vcm2 voltage is supplied to a negative terminal (shown as '−') of op-amp 451 and to a positive terminal (shown as '+') of op-amp 452.

In one embodiment, op-amps 451 and 452 may be high gain electronic voltage amplifiers with differential inputs (as shown by two input terminals) and a single-ended output (as shown by one output terminal). When there is a positive difference between the signals supplied to the positive and negative input terminals, the output terminal may generate a logic high output voltage. In such instances, the output voltage may be between the VDD/2 and VDD voltage levels to indicate a logic high state. However, when there is a negative difference between the signals supplied to the positive and negative input terminals, the output terminal may generate a logic low output voltage. In such instances, the output voltage may be between the VDD/2 and VSS voltage levels to indicate a logic low state. Voltage VDD is a high supply voltage, and voltage VSS is a low supply voltage, such as ground.

As shown in the embodiment of FIG. 4, op-amps 451 and 452 may generate output signals Vctrl1 and Vctrl2, respectively. The Vctrl1 and Vctrl2 signals, as stated above, may either be in the logic high state or the logic low state. The Vctrl1 signal may be supplied to a gate terminal of transistor 442, and the Vctrl2 signal may be supplied to a gate terminal of transistor 441.

Each of the transistors 441 and 442 may have one of its source-drain terminals coupled to pad 420 and another one of its source-drain terminals coupled to resistor 443. Only one transistor 441 or 442 may be activated and in a negative feedback loop at any one time, in one embodiment. This is because the input voltages (i.e., the Vcm1 and Vcm2 voltages) are supplied in a complementary manner to the input terminals of op-amps 451 and 452. For example, the Vcm1 and Vcm2 voltages are supplied to the positive and negative input terminals, respectively, of op-amp 451, whereas the Vcm1 and Vcm2 voltages are supplied to the negative and positive input terminals, respectively, of op-amp 452. As a result, the Vctrl1 and Vctrl2 voltages may also be of complementary voltage levels, which cause only one transistor 441 or 442 to be activated and in a negative feedback loop at any one time.

The Vcm2 voltage is continuously adjusted until a voltage drop across transistor 441 or 442 is identical to the voltage drop across resistor 443. The continuous adjustment may occur because transistor 441 or 442 forms part of the negative feedback loop with the respective op-amp 451 or 452 as shown in the embodiment of FIG. 4. In one embodiment, impedance generated across one of the transistors 441 or 442 may be similar to the resistance of resistor 443. The impendence of transistor 441 or 442 may be similar to 50 Ohms when the resistance of resistor 443 is 50 Ohms, in accordance to one exemplary embodiment. The impendence of transistor 441 or 442 may be similar to 100 Ohms when the resistance of resistor 443 is 100 Ohms, in accordance to another exemplary embodiment.

However, there are instances whereby both transistors 441 and 442 are activated. Such instances may occur when the difference between the Vcm1 and Vcm2 voltages is significantly small. As a result of this small difference between the Vcm1 and Vcm2 voltages, op-amps 451 and 452 may behave in a linear region with respect to an output voltage over an input voltage relationship. However, even in such instances, transistors 441 and 442 may still generate impedances that are equivalent to the resistance of resistor 443.

Still referring to FIG. 4, resistor 443 may be a high-precision resistor. A high precision resistor is generally a resistor that is manufactured using significantly low manufacturing tolerances. It should be appreciated that a high precision resistor may be needed for resistor 443, because impedances generated across transistors 441 and 442 may be based on the resistance of resistor 443. In one embodiment, the resistance of resistor 443 may be significantly smaller than the resistances of resistors 421 and 431. As stated above, the resistance of resistor 443 may be 50 Ohms.

Figure 5:
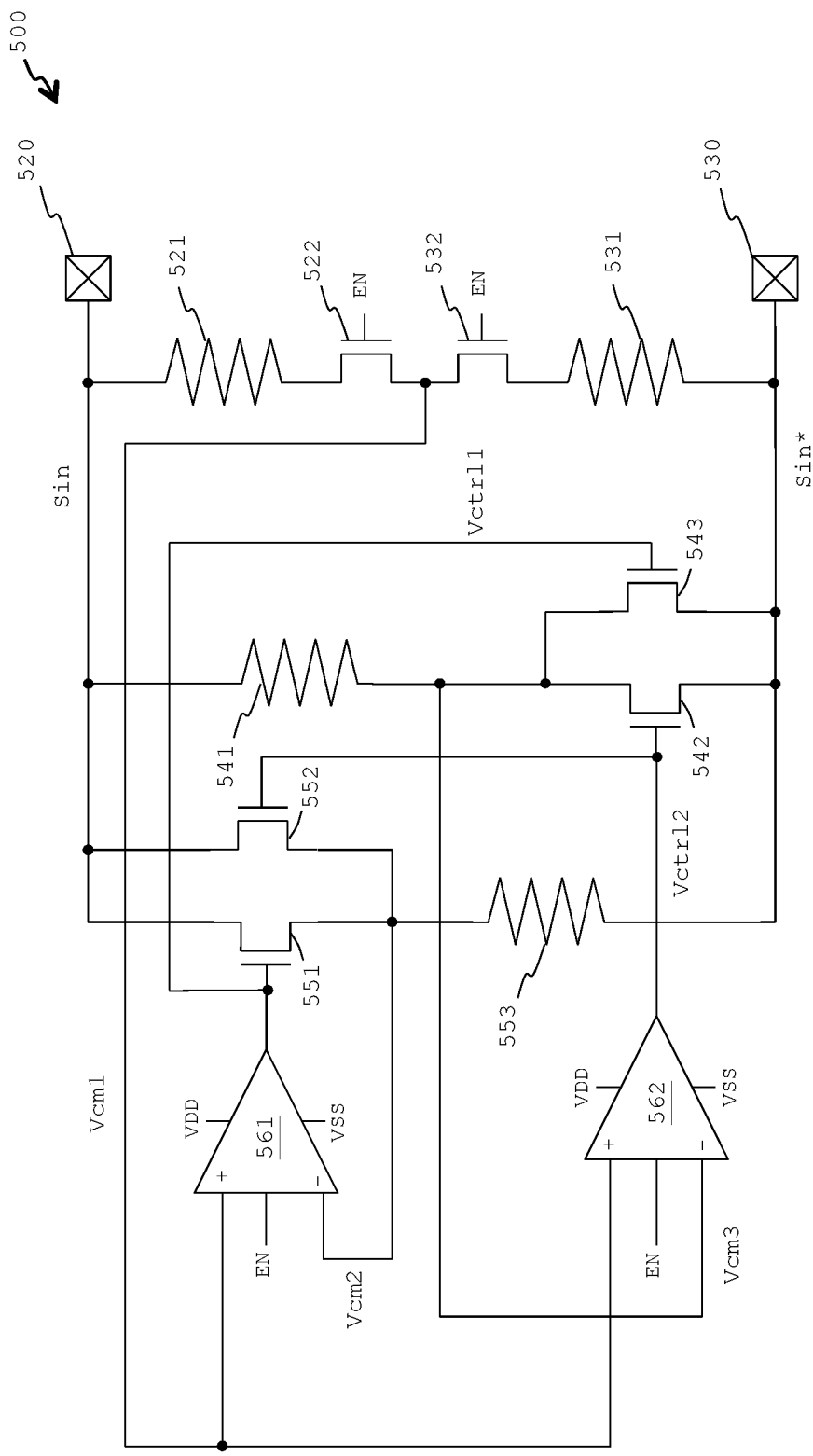
FIG. 5 shows an illustrative detailed implementation of a balanced termination circuit in accordance with one embodiment of the present invention.

FIG. 5, meant to be illustrative and not limiting, illustrates a detailed implementation of a balanced termination circuit in accordance with one embodiment of the present invention. Termination circuit 500 may be an example of termination circuit 240 of FIG. 2. As shown in the embodiment of FIG. 5, termination circuit 500 may include pads 520 and 530, transistors 522, 532, 543, 542, 551 and 552, resistors 521, 531, 541 and 553, and op-amps 561 and 562. Op-amps 561-562 are enabled in response to the EN signal.

In one embodiment, pads 520 and 530, transistors 522 and 532 and resistors 521 and 531 may be similar to pads 420 and 430, transistors 422 and 432 and resistors 421 and 431, respectively, of FIG. 4. Furthermore, transistors 522 and 532 and resistors 521 and 531 may also be utilized to generate a common mode voltage (Vcm1) that is similar to the voltage Vcm1 of FIG. 4. Therefore, the details of pads 520 and 530, transistors 522 and 532 and resistors 521 and 531 will not be repeated for the sake of brevity.

Furthermore, the Vcm1 voltage is supplied to op-amps 561 and 562. Op-amps 561 and 562 may be similar to op-amps 451 and 452 of FIG. 4, in one embodiment. However, the supplied inputs to op-amps 561 and 562 may be different when compared to op-amps 451 and 452 of FIG. 4. In one embodiment, the Vcm1 voltage is supplied to positive input terminals (shown as '+') of op-amps 561 and 562. The other input terminal (shown as '−') of op-amp 561 is supplied with a common mode voltage (Vcm2) generated on a node of a resistive path circuit that includes transistors 551 and 552 and resistor 553. The other input terminal (shown as '−') of op-amp 562 is supplied with a common mode voltage (Vcm3) generated on a node of a resistive path circuit that includes resistor 541 and transistors 542 and 543.

As shown in the embodiment of FIG. 5, op-amps 561 and 562 may generate output signals Vctrl1 and Vctrl2, respectively. Similar to the Vctrl1 and Vctrl2 signals in FIG. 4, the Vctrl1 and Vctrl2 signals in FIG. 5 may either be in the logic high state or the logic low state. The Vctrl1 signal may be supplied to gate terminals of transistors 551 and 543. The Vctrl2 signal may be supplied to gate terminals of transistors 542 and 552.

Referring still to FIG. 5, each of the transistors 551 and 552 may have one of its source-drain terminals coupled to pad 520 and another of its source-drain terminals coupled to resistor 553. Furthermore, each of the transistors 542 and 543 may have one of its source-drain terminals coupled to pad 530 and another of its source-drain terminals coupled to resistor 541.

In one embodiment, only one transistor 551 or 552 is activated and in a negative feedback loop within the resistive path circuit that includes transistors 551 and 552 and resistor 553. In addition, only one transistor 542 or 543 is activated and in a negative feedback loop within the resistive path circuit that includes transistors 542 and 543 and resistor 541. The reason for only one transistor among transistors 551 and 552 and another one transistor among transistors 542 and 543 being activated is similar to the activation of transistors 441 and 442 in the embodiment of FIG. 4.

The Vcm2 voltage is continuously adjusted until a voltage drop across transistor 551 or 552 is identical to a voltage drop across resistor 553. Furthermore, the Vcm3 voltage is also continuously adjusted until a voltage drop across transistor 542 or 543 is identical to a voltage drop across resistor 541. The adjustments on the Vcm2 and Vcm3 voltages may continuously occur because transistors 542, 543, 551 and 552 form part of negative feedback loops formed by corresponding op-amps 561 and 562 as shown in the embodiment of FIG. 5. In one embodiment, the impedance generated across one of the transistor 551 or 552 may be similar to the resistance of resistor 553. Furthermore, the impedance generated across one of the transistor 542 or 543 may be similar to the resistance of resistor 541. For example, the impedance generated across one of transistor 551 or 552 may be similar to 100 Ohms when the resistance of resistor 553 is 100 Ohms. Similarly, the impedance generated across one of transistor 542 or 543 may be similar to 100 Ohms when the resistance of resistor 541 is 100 Ohms.

Termination circuit 500 provides a more balanced design compared to termination circuit 400 of FIG. 4. As shown in the embodiment of FIG. 5, each pad 520 and 530 may be directly connected to a pair of parallel connected transistors and a resistor. This is unlike the embodiment of FIG. 4 whereby a pad is directly connected to a pair of transistors and another pad is directly connected to a resistor. It should be appreciated that a more balanced circuit design (e.g., termination circuit 500) is always preferred when high speed signals are involved.

Figure 6:
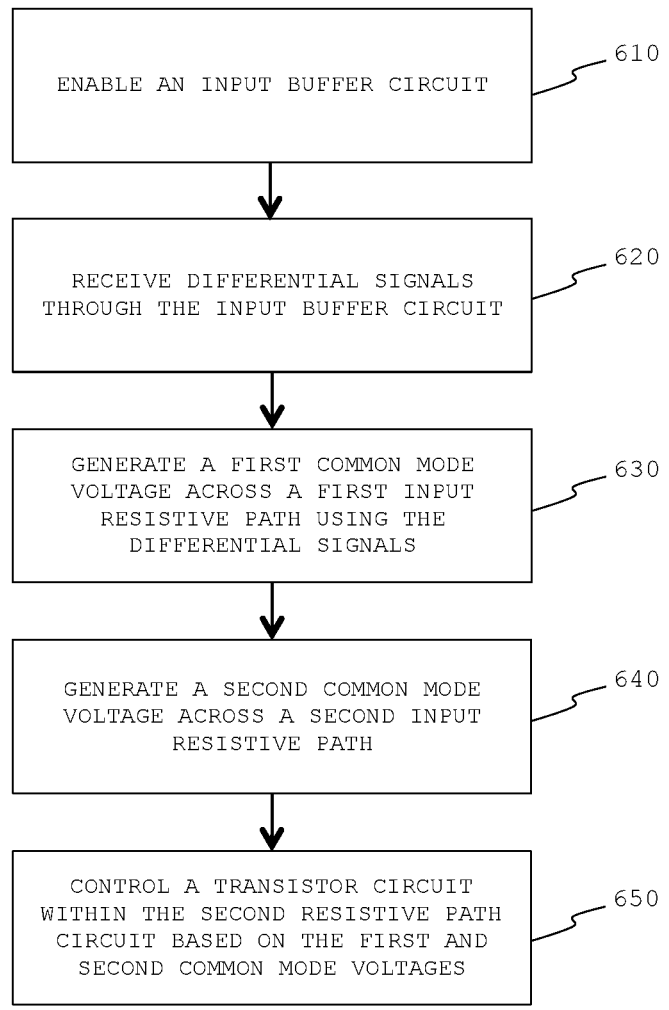
FIG. 6 shows a flowchart of an illustrative method for operating an input buffer circuit in accordance with one embodiment of the present invention.

FIG. 6, meant to be illustrative and not limiting, illustrates a flowchart of a method for operating an input buffer circuit in accordance with one embodiment of the present invention. The input buffer circuit may be similar to input buffer circuit 200 of FIG. 2. The input buffer circuit may include a termination circuit. In one exemplary embodiment, the termination circuit may be similar to termination circuit 400 of FIG. 4 or termination circuit 500 of FIG. 5.

At step 610, the input buffer circuit is enabled. The input buffer circuit is enabled only when the I/O circuit (e.g., I/O circuit 120 of FIG. 1) is in a receiver mode. The input buffer circuit may be enabled by providing an appropriate logic value through an enabling signal. The enabling signal may be similar to the EN signal as shown in the embodiments of FIGS. 4 and 5. The EN signal may activate the input buffer circuit when the EN signal contains a logic high value. Alternatively, the EN signal may deactivate the input buffer circuit when the EN signal contains a logic low value.

At step 620, differential signals are received through the input buffer circuit. In one embodiment, the differential signals may be similar to Sin and Sin* as shown in FIGS. 2, 3, 4 and 5. The differential signals may be based on a LVDS protocol, in one embodiment. Alternatively, the differential signals may be based on a LVPECL protocol. The signals may be received through pads (e.g., pads 420 and 430 of FIG. 4 or pads 520 and 530 of FIG. 5).

At step 630, a first common mode voltage is generated across a first resistive path circuit of the termination circuit using the differential signals. In one embodiment, the first resistive path circuit may be similar to resistive path circuit 310 of FIG. 3, a resistive path circuit that includes resistors 421 and 431 and transistors 422 and 432 of FIG. 4, or a resistive path circuit that includes resistors 521 and 531 and transistors 522 and 532 of FIG. 5. The first common mode voltage may be similar to the voltage Vcm1.

At step 640, a second common mode voltage is generated across a second resistive path circuit of the termination circuit. In one embodiment, the second resistive path circuit may be similar to resistive path circuit 320 of FIG. 3 or a resistive path circuit that includes resistor 443 and transistors 441 and 442 of FIG. 4. The second common mode voltage may be similar to voltage Vcm2.

In some exemplary termination circuit embodiments, there may be more than two resistive paths that generate more than two common mode voltages. For example, in the embodiment of FIG. 5, one of the resistive path circuits that includes transistors 551 and 552 and resistor 553 may generate a second common mode voltage (Vcm2) and another of the resistive path circuits that includes resistor 541 and transistors 542 and 543 may generate a third common mode voltage (Vcm3).

At step 650, the transistors within the second resistive path circuit are controlled to provide appropriate impedances to the incoming differential signals based on the first and second common mode voltages. In one embodiment, the appropriate impedances may be similar to the resistance of the resistor that is in the resistive path circuit. For example, in the embodiment of FIG. 4, transistor 441 or 442 may be controlled to provide similar resistance as the resistance of resistor 443. The control signals may be generated by operational amplifiers (e.g., op-amps 451 and 452 of FIG. 4). The control signals may be similar to the Vctrl1 and Vctrl2 signals.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by Intel Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purpose of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An input termination circuit that receives differential signals, comprising:
   a first resistive path circuit that generates a first common mode voltage from the differential signals;
   a feedback circuit that is coupled to the first resistive path circuit and that receives the first common mode voltage as an input; and
   a second resistive path circuit comprising a transistor circuit and a first resistor,
   wherein the second resistive path circuit generates a second common mode voltage from the differential signals on a node between the transistor circuit and the first resistor in response to an output of the feedback circuit controlling the transistor circuit, and
   wherein the feedback circuit adjusts a voltage level of the second common mode voltage based on the first common mode voltage.

2. The input termination circuit as defined in claim 1, wherein the feedback circuit comprises:
   a first operational amplifier circuit that receives the first common mode voltage on a positive input terminal and the second common mode voltage on a negative input terminal; and
   a second operational amplifier circuit that receives the first common mode voltage on a negative input terminal and the second common mode voltage on a positive input terminal.

3. The input termination circuit as defined in claim 2, wherein the transistor circuit of the second resistive path circuit comprises:
   first and second transistors coupled in a parallel circuit configuration, wherein a gate terminal of the first transistor is coupled to an output terminal of the first operational amplifier circuit, and a gate terminal of the second transistor is coupled to an output terminal of the second operation amplifier circuit.

4. The input termination circuit as defined in claim 3, wherein the first and second transistors are re-channel transistors.

5. The input termination circuit as defined in claim 3, wherein the first resistor in the second resistive path circuit has a resistance of approximately 50 Ohms.

6. The input termination circuit as defined in claim 3, wherein the first resistive path circuit comprises:
   second and third resistors having substantially identical resistances; and
   third and fourth transistors having substantially identical widths and are coupled between the second and third resistors, wherein the second and third resistors and the third and fourth transistors are coupled in a serial circuit configuration, and wherein the first common mode voltage is generated on a node located between the third and fourth transistors.

7. The input termination circuit as defined in claim 6, wherein widths of the first and second transistors are larger than the widths of the third and fourth transistors, and wherein the resistance of each of the second and third resistors is larger than a resistance of the first resistor in the second resistive path circuit.

8. The input termination circuit as defined in claim 1, comprising:
   a third resistive path circuit comprising an additional transistor circuit and an additional resistor,
   wherein the additional transistor circuit and the additional resistor are coupled together in a serial circuit configuration, and
   wherein the third resistive path generates a third common mode voltage from the differential signals on a node between the additional transistor circuit and the additional resistor in response to the output of the feedback circuit controlling the additional transistor circuit, and
   wherein voltage levels of the third common mode voltage and the first and second common mode voltages are substantially identical.

9. An integrated circuit comprising an input termination circuit, wherein the input termination circuit comprises:
   a first operational amplifier circuit having an output terminal;
   a second operational amplifier circuit having an output terminal;
   first and second transistors coupled in a parallel circuit configuration, wherein a control input of the first transistor is coupled to the output terminal of the first operational amplifier circuit, and a control input of the second transistor is coupled to the output terminal of the second operation amplifier circuit; and
   a first resistor that is coupled in a series circuit configuration with the first and second transistors, wherein the first and second operational amplifier circuits control a voltage drop across the first and second transistors based on a voltage drop across the first resistor.

10. The integrated circuit as defined in claim 9, wherein the input termination circuit further comprises:
   a resistive path circuit comprising second and third resistors that generates a common mode voltage from differential input signals received at the integrated circuit, wherein the common mode voltage is provided to an input of each of the first and second operational amplifier circuits.

11. The integrated circuit as defined in claim 9, wherein a node between the first and second transistors and the first resistor is coupled to an input of each of the first and second operational amplifier circuits.

12. The integrated circuit as defined in claim 9, wherein each of the first and second operational amplifier circuits comprises an enabling input for enabling each of the first and second operational amplifier circuits.

13. The integrated circuit as defined in claim 9, wherein a common mode voltage is generated from differential input signals on a node between the first and second transistors and the first resistor.

14. The integrated circuit as defined in claim 9, wherein the first operational amplifier circuit and the first transistor form a first negative feedback loop circuit, and wherein the second operational amplifier circuit and the second transistor form a second negative feedback loop circuit.

15. An input termination circuit receiving differential signals, comprising:
   a first resistive path, comprising:
      a first transistor circuit that receives a positive part of the differential signals and that is controlled by negative feedback loop outputs; and
      a first resistor coupled in series with the first transistor circuit; and
   a second resistive path, comprising:
      a second transistor circuit that receives a negative part of the differential signals and that is controlled by the negative feedback loop outputs; and
      a second resistor coupled in series with the second transistor circuit.

16. The input termination circuit as defined in claim 15, wherein the first transistor circuit further comprises first and second transistors coupled in a parallel circuit configuration and the second transistor circuit further comprises third and fourth transistors coupled in another parallel circuit configuration.

17. The input termination circuit as defined in claim 16, wherein each of the first, second, third and fourth transistors generates a termination impedance across first and second pads of an integrated circuit when the first, second, third and fourth transistors are activated.

18. The input termination circuit as defined in claim 15, wherein the first resistor is coupled to a node that receives the negative part of the differential signals, and wherein the second resistor is coupled to a node that receives the positive part of the differential signals.

19. The input termination circuit as defined in claim 16, further comprising:
   a first operational amplifier circuit that receives a common mode voltage for the differential signals and a divided voltage across the first and second transistors and the first resistor; and
   a second operational amplifier circuit that receives the common mode voltage for the differential signals and a divided voltage across the third and fourth transistors and the second resistor.

20. The input termination circuit as defined in claim 15, further comprising:
   a third resistive path, comprising:
      first and second transistors; and
      third and fourth resistors, wherein the first and second transistors and the third and fourth resistors are coupled serially, and wherein resistances of the third and fourth resistors are larger than resistances of the first and second resistors.

* * * * *